United States Patent [19]
Fujii

[11] Patent Number: 5,357,219
[45] Date of Patent: Oct. 18, 1994

[54] PULSE WIDTH MODULATOR INCLUDING INCREMENTER/DECREMENTER

[75] Inventor: Takeshi Fujii, Itami, Japan

[73] Assignee: Mitsubishi Denki Kabushiki Kaisha, Tokyo, Japan

[21] Appl. No.: 128,789

[22] Filed: Sep. 30, 1993

[30] Foreign Application Priority Data

Oct. 5, 1992 [JP] Japan .................................. 4-266014

[51] Int. Cl.$^5$ ............................................. H03K 7/08
[52] U.S. Cl. ..................................... 332/109; 375/22; 318/599; 318/811; 388/811
[58] Field of Search ................. 332/109, 110, 111; 375/22; 318/811, 599; 388/811

[56] References Cited

U.S. PATENT DOCUMENTS 4,502,024 2/1985 Nishikawa et al. ................. 332/109

Primary Examiner—Siegfried H. Grimm
Attorney, Agent, or Firm—Lowe, Price, LeBlanc & Becker

[57] ABSTRACT

A pulse width modulator comprises: a reload register (8) which stores data D1 set as an initial value of data D and loads to a waveform timer (3), every time one waveform cycle is counted; a comparing circuit (10) which compares the data D1 and data D2 when the data D1 is changed to the data D2; and an incrementer/decrementer (9) which functions as an increment when the data D2 is larger than the data D1 as the comparing result, and as an decrementer when smaller, and every time the one waveform cycle is counted by a cyclic timer (7), increments or decrements the data D1 held in the waveform timer (3); and changes the ratio of an "H" level period and an "L" level period of an output waveform relatively slowly, against the rate of change (from D1 to D2) of a set value D of a timer register (2) for setting the "H" level period and the "L" level period of a pulse width modulation waveform.

8 Claims, 11 Drawing Sheets

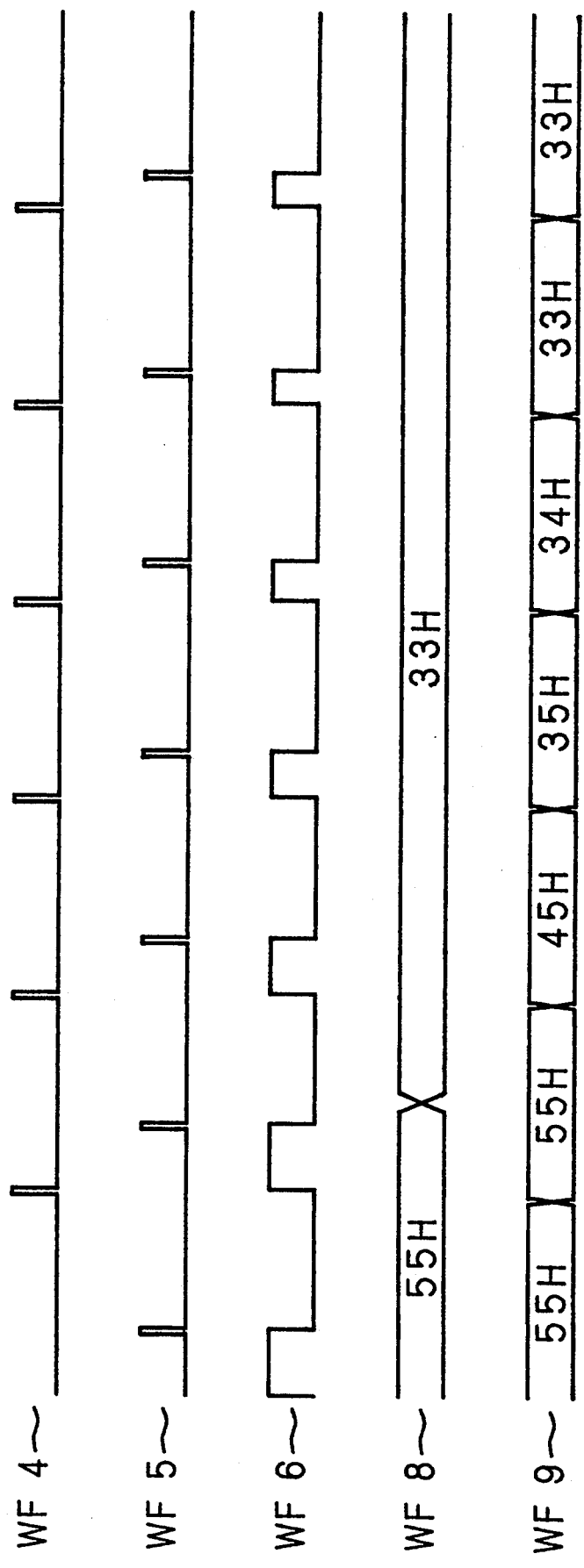

PULSE WIDTH MODULATOR INCLUDING INCREMENTER/DECREMENTER

BACKGROUND OF THE INVENTION

1. Field of the Invention

The present invention relates to a pulse width modulator, more specifically, it relates to a pulse width modulator which is, particularly, used preferably in controlling a DC motor, wherein the pulse width of the output signal changes slowly when a pulse width of an output signal is controlled to change.

2. Description of the Prior Art

As a pulse width modulator used in controlling a DC motor, a so-called PWM (Pulse Width Modulation) modulator, or a PPM (Pulse Position Modulation) modulator and the like are practically used as the prior art.

FIG. 1 is a block diagram showing a general configuration of an 8-bit PWM modulator as one example of such prior art.

In FIG. 1, numeral 1 designates a data bus connected to a CPU 21 which is a control center of an entire PWM modulator.

Numeral 2 designates an 8-bit timer register as first storing means, and 8 bits in the data bus 1 are connected thereto via a signal line 51. An 8-bit set value outputted to the data bus 1 from the CPU 21 is stored in the timer register 2.

Numeral 3 designates an 8-bit waveform timer as second timing means. The waveform timer 3 is connected to the above-mentioned timer register 2 through a signal line 52 provided with a gate 41 in the midway thereof. When the gate 41 is opened, the 8-bit set value stored in the timer register 2 is loaded as count data. While, a count clock serving as a source clock is inputted to the waveform timer 3 via a signal line 60, thereby the count clock is counted down with a value loaded from the timer register 2 as an initial value of the count data, and a count value is outputted to a waveform timer overflow control circuit 4 via a signal line 54. However, the waveform timer 3 starts its counting operation when a count start trigger is given from a cyclic timer overflow control circuit 6 to be described later via a signal line 56.

As stated above, the waveform timer overflow control circuit 4 inputs the count value of the waveform timer 3 given from the waveform timer 3 via the signal line 54, and when the value overflows, or specifically, when it becomes "00H" (H represents a hexadecimal number), outputs a waveform trigger signal to a waveform generating circuit 5 being a waveform generating means via a signal line 55.

The waveform generating circuit 5 generates a PWM output waveform as an output signal of a PWM modulator whose entire configuration is shown in FIG. 1, and outputs it to the outside via a signal line 58. Specifically, when the waveform trigger signal is given from the waveform timer overflow control circuit 4 via the signal line 55, the waveform generating circuit 5 outputs an "L" level signal thereafter, and when the waveform trigger signal is given from the cyclic timer overflow control circuit 6 to be described later via a signal line 57, outputs an "H" level signal thereafter.

In other words, the waveform generating circuit 5 changes the PWM output waveform into "L" level when the waveform trigger signal is given from the waveform timer overflow control circuit 4, and changes the PWM output waveform into "H" level when the waveform trigger signal is given from the cyclic timer overflow control circuit 6.

Numeral 7 designates an 8-bit cyclic timer as first timing means, to which is inputted the count clock via the signal line 60 in the same way as the waveform timer 3. The cyclic timer 7 repeats the down counting operation of the count clock from "FFH" to "00H", and outputs the count value to the cyclic timer overflow control circuit 6 via a signal line 59.

When the count value of the cyclic timer 7 inputted via the signal line 59 becomes "00H", the cyclic timer overflow control circuit 6 outputs the waveform trigger signal to the waveform generating circuit 5 via the signal line 57, the count start trigger signal to the waveform timer 3 via the signal line 56, and an input control signal of count data to the gate 41 via the signal line 53.

The gate 41 is provided so as to load the set value of the timer register 2 to the waveform timer 3 as the count data as stated above. As stated above, the gate 41 is opened and closed by the input control signal of the count data given from the cyclic timer overflow control circuit 6 via the signal line 53.

Next, the operation of a conventional PWM modulator having the aforementioned configuration is described.

In a state where the PWM modulator is not operating, the gate 41 which controls the count data input to the waveform timer 3 is opened, thus when the CPU 21 writes set value data into the 8-bit timer register 2 from the data bus 1 via the signal line 51, the set value is stored in the 8-bit waveform timer 3 as count data via the signal line 52.

Now, for example, it is assumed that "55H" is written into the timer register 2 as an initial value of the count data of the waveform timer 3.

When the PWM modulator is started after writing the count data into the waveform timer 3, it starts simultaneously with the 8-bit cyclic timer 7. The waveform timer 3 counts down the count clock signal inputted via the signal line 60, from the initial value "55H" of the count data. "FFH" is written into the 8-bit cyclic timer 7 as the initial value, and the count clock signal inputted via the signal line 60 is counted down.

FIG. 2 is waveform diagrams showing an operating state of a PWM modulator.

Symbol WF1 designates a count clock, WF2 designates a count value of a cyclic timer 7, WF3 designates a count value of a waveform timer 3, WF4 designates a waveform trigger signal outputted from a cyclic timer overflow control circuit 6, WF5 designates a waveform trigger signal outputted from a waveform timer overflow control circuit 4 and WF6 designates a PWM output waveform outputted from a waveform generating circuit 5. In addition, symbol OF represents an overflow cycle of a cyclic timer 7, or one cycle of a PWM waveform.

It is assumed that the PWM output waveform at the time point of starting of the PWM modulator is at "H" level as shown by WF6 in FIG. 2. The waveform timer 3 and the cyclic timer 7 have started simultaneously, however, the count value of the waveform timer 3 becomes "00H" first as shown by WF3 in FIG. 2. Though the waveform timer 3 stops to operate when its count value becomes "00H", the waveform timer overflow control circuit 4 outputs the waveform trigger signal to the waveform generating circuit 5 via the signal line 55 as shown by WF5 in FIG. 2. The waveform generating circuit 5 receiving the waveform trigger signal from the waveform timer overflow control circuit 4, inverts the PWM output waveform which has been at, "H" level and outputted to the signal line 58, into "L" level as shown by WF6 in FIG. 2.

Thereafter, when the count value of the cyclic timer 7 becomes "00H" as shown by WF2 in FIG. 2, the cyclic timer overflow control circuit 6 outputs the waveform trigger signal to the waveform generating circuit 5 via the signal line 57 as shown by WF4 in FIG. 2, and outputs a signal opening the gate 41, through which count data of the waveform timer 3 is inputted via the signal line 53.

Thereby, a value stored in the timer register 2 is again inputted to the waveform timer 3.

Also, the cyclic timer overflow control circuit 6 simultaneously outputs a start signal to the waveform timer 3 via the signal line 56. The waveform timer 3 starts to operate in synchronism with the cyclic timer 7 so as to coincide with the timing at the starting time of the PWM modulator.

While, the waveform generating circuit, 5 which has received the waveform trigger signal from the cyclic timer overflow control circuit. 6, inverts the PWM output waveform, having been at "L" level and outputted to the signal line 58, into "H" level as shown by WF6 in FIG. 2.

By repeating the above-mentioned operations, a waveform whose period of "one cycle×55H of the count clock" becomes the "H" level, and period of "one cycle×ABH of the count clock" becomes the "L" level with the period shown by OF in FIG. 2 as one waveform cycle, is outputted repeatedly.

While, when the set value of the timer register 2 is changed during the operation of the PWM modulator, since the gate 41 opens and a new set value is inputted to the waveform timer 3 as count data at the time point when the cyclic timer 7 has overflown, the length of "H" level period of the PWM waveform changes from the next cycle.

FIG. 3 is a waveform diagram showing changes of waveforms when changing the value of the timer register 2. In FIG. 3, the same reference numerals as in FIG. 2 designate the same signal waveforms. Here, in FIG. 3, WF8 shows the set value of the timer register 2 and φ represents one cycle of the count clock.

When the set value of the timer register 2 changes, for example, to "40H" from "55H" as shown by WF8 in FIG. 3 during the operation of the PWM modulator, "40H" is inputted to the waveform timer 3 as count data at the next overflow timing of the cyclic timer 7. And, a wave for whose period of "one cycle×40H of the count clock" of the output waveform of the waveform generating circuit 5 becomes the "H" level from the next waveform cycle, and whose period of "one cycle×C0H of the count clock" becomes "L" level is outputted.

In the conventional pulse width modulator, since a change of a value of the register which sets the ratio of the "H" level period and the "L" level period of the output waveform is immediately reflected to the output waveform, it is necessary to change the set value of the register little by little in multisteps, when the number of revolutions is to be changed slowly at the time of controlling a DC motor, resulting in a heavy burden of softwares.

SUMMARY OF THE INVENTION

The present invention has been devised in view of such circumstances, therefore, it is an object thereof to provide a pulse width modulator, wherein the ratio of an "H" level period and an "L" level period of an output waveform changes relatively slowly against the rate of change of a set value of a register for setting the "H" level period and the "L" level period of a pulse width modulation waveform.

A first invention of the pulse width modulator of the present invention comprises; first timing means (cyclic timer) for repetitively timing one waveform cycle, by repeating the counting operation of a source clock till coinciding with a predetermined count data; first storing means (timer register) for storing n-bit input digital data D; second timing means (wave form timer) for, to which the data D stored in the first storing means is loaded as the count data, timing a first period corresponding to "one cycle of the source clock×D", by counting the source clock till coinciding with the loaded count data; waveform generating means (waveform generating circuit) for generating a first level signal in a first period timed by the second timing means, and a second level signal in a second period corresponding to the remaining period, in the respective one-waveform cycles timed by the first timing means; and further comprises; second storing means (reload register) for storing data D1 stored as an initial value of the data D in the first storing means, and loading to the second timing means every time the one waveform cycle is timed by the first timing means; comparing means (comparing circuit) for comparing data D2 and the data D1 stored in the second storing means when the data D1 stored in the first storing means is changed to the data D2; and incrementing/decrementing means (incrementer/decrementer) for, which function as an incrementer when the comparing result by the comparing means shows that the data D2 is larger than the data D1 and as a decrementer when smaller, incrementing or decrementing the data D1 stored in the second storing means every time the one waveform cycle is timed by the first timing means.

A second invention of the pulse width modulator of the present invention further comprises in addition to the configuration of the first invention; third storing means (interval register) for storing an optional value; and third timing means (interval timer) for timing an interval cycle corresponding to the optional value, by counting a waveform cycle timed by the first timing means (cyclic timer) till coinciding with the optional value stored in the third storing means; and in which incrementing/decrementing means (incrementer/decrementer) functions as an incrementer when the data D2 larger than the data D1 as the comparing result by the comparing means (comparing circuit) and as a decrementer when smaller, and increments or decrements the data D1 stored in the second storing means (reload register) every time the one interval cycle is timed by the third timing means.

A third invention of the pulse width modulator of the present invention further comprises in addition to the configuration of the first invention; first comparing means (comparing circuit) for comparing data D2 and the data D1 stored in the second storing means (reload register) when the data D1 stored in the first storing means (timer register) is changed to the data D2; and second comparing means (comparing circuit) for comparing the lower m bits of the data D2 and the lower m bits of the data D1 stored in the second storing means when the data D1 stored in the first storing means is changed to the data D2; and in which the incrementing-/decrementing means (incrementer/decrementer) functions as an incrementer of a lowermost bit when the comparing result by the second comparing means shows that the data D1 and D2 do not coincide with each other and the comparing result by the first, comparing means shows that the data D2 is larger than the data D1 and as a decrementer of the lowermost bit when smaller, and functions as an incrementer of the $2^m$th bit from the lowermost bit when the comparing result by the second comparing means shows that the data D1 and D2 coincide with each other and the comparing result by the first comparing means shows that the data D2 is larger than the data D1 and as a decrementer of the $2^m$th bit from the lowermost bit when smaller, and increments or decrements the data D1 stored in the second storing means every time the one waveform cycle is timed by the first timing means.

A fourth invention of the pulse width modulator of the present invention further comprises in addition to the configuration of the first invention; first comparing means (comparing circuit) for comparing data D2 and the data D1 stored in the second storing means (reload register) when the data D1 stored in the first storing means (timer register) is changed to the data D2; and second comparing means (comparing circuit) for comparing whether or not the difference between the data D2 and the data D1 stored in the second storing means is below $2^m$ when the data D1 stored in the first, storing means is changed to the data D2; and ill which the incrementing/decrementing means (incrementer/-decrementer) functions as an incrementer of the $2^m$th bit from the lowermost bit when the comparing result by the second comparing means is larger than $2^m$ and the comparing result by the first comparing means shows that the data D2 is larger than the data D1 and as a decrementer of the $2^m$th bit from the lowermost bit when smaller, and functions as the incrementer of the lowermost bit when the comparing result by the second comparing means is below $2^m$ and the comparing result by the first comparing means shows that the data D2 is larger than the data D1 and as a decrementer of the lowermost bit when smaller, and increments or decrement the data D1 stored in the second storing means every time the one waveform cycle is timed by the first timing means.

A fifth invention of the pulse width modulator of the present invention further comprises in each of the above-mentioned inventions; first controlling means (gate) for, when a predetermined signal is given, controlling the data stored in the first storing means to be always inputted to and stored in the second storing means; second controlling means (gates) for, when the predetermined signal is given, controlling the incrementing/decrementing means to inhibit increment or decrement a stored value in the second storing means; and third controlling means (1-bit register) for controlling the predetermined signal to be given to the first and second controlling means responsive to the control by softwares or a signal inputted from the outside.

In the first invention of the pulse width modulator of the present invention, when data D which sets the first level length rate of a pulse width modulation waveform stored in the first storing means (the timer register) is changed, the first level length rate of an output waveform is incremented or decremented by one cycle of a source clock by the incrementing/decrementing means (incrementer/decrementer) every time whenever the one waveform cycle elapses.

In the second invention of the pulse width modulator of the present invention, when the data D which sets the first level length rate of the pulse width modulation waveform stored in the first storing means (timer register) is changed, the first level length rate of the output waveform is incremented or decremented by one cycle of the source clock by the incrementing/decrementing means (incrementer/decrementer) every time the waveform cycle decided by a value stored in the third storing means(interval register) which is set by the softwares or inputted from the outside, elapses.

In the third invention of the pulse width modulator of the present invention, when the data D1 which sets the first level length rate of the pulse width modulation waveform stored in the first storing means(timer register) is changed to the data D2, the first level length rate of the output waveform is incremented or decremented by the incrementing/decrementing means (incrementer/decrementer) by one cycle of the source clock every time the one waveform cycle elapses as a first step, and by $2^m$ cycles of the source clock every time the one waveform cycle elapses as a second step, after the lower m bits of data which sets the first level length rate of the output waveform during the change, coincide with the lower m bits of the data D2.

In the fourth invention of the pulse width modulator of the present invention, when the data D1 which sets the first level length rate of the pulse width modulation waveform stored in the first storing means (timer register) is changed to the data D2, the first level length rate of the output waveform is incremented or decremented by the incrementing/decrementing means (incrementer/decrementer) by $2^m$ cycles of the source clock every time the one waveform cycle elapses as a first step, and by one cycle of the source clock every time the one waveform cycle elapses as a second step when $D2-D2' \leq 2^m$, where D2 represents data which sets the first level length rate of the output waveform during the change.

In the fifth invention of the pulse width modulator of the present invention, whether to operate as the pulse width modulator of the above-mentioned inventions or to operate as the conventional pulse width modulator, can be switched by the third controlling means responsive to the control by softwares or a signal inputted from the outside.

The above and further objects and features of the invention will more fully be apparent from the following detailed description with accompanying drawings.

BRIEF DESCRIPTION OF THE DRAWINGS

FIG. 11 is a waveform diagram showing changes of waveforms of signals, when a value of a timer register is changed in a PWM modulator of a fourth invention of a pulse width modulator of the present invention.

DESCRIPTION OF THE PREFERRED EMBODIMENTS

In the following, the present invention is particularly described on the basis of the drawings showing its embodiments.

At first, a first invention of a pulse width modulator of the present invention is described.

Figure 1:
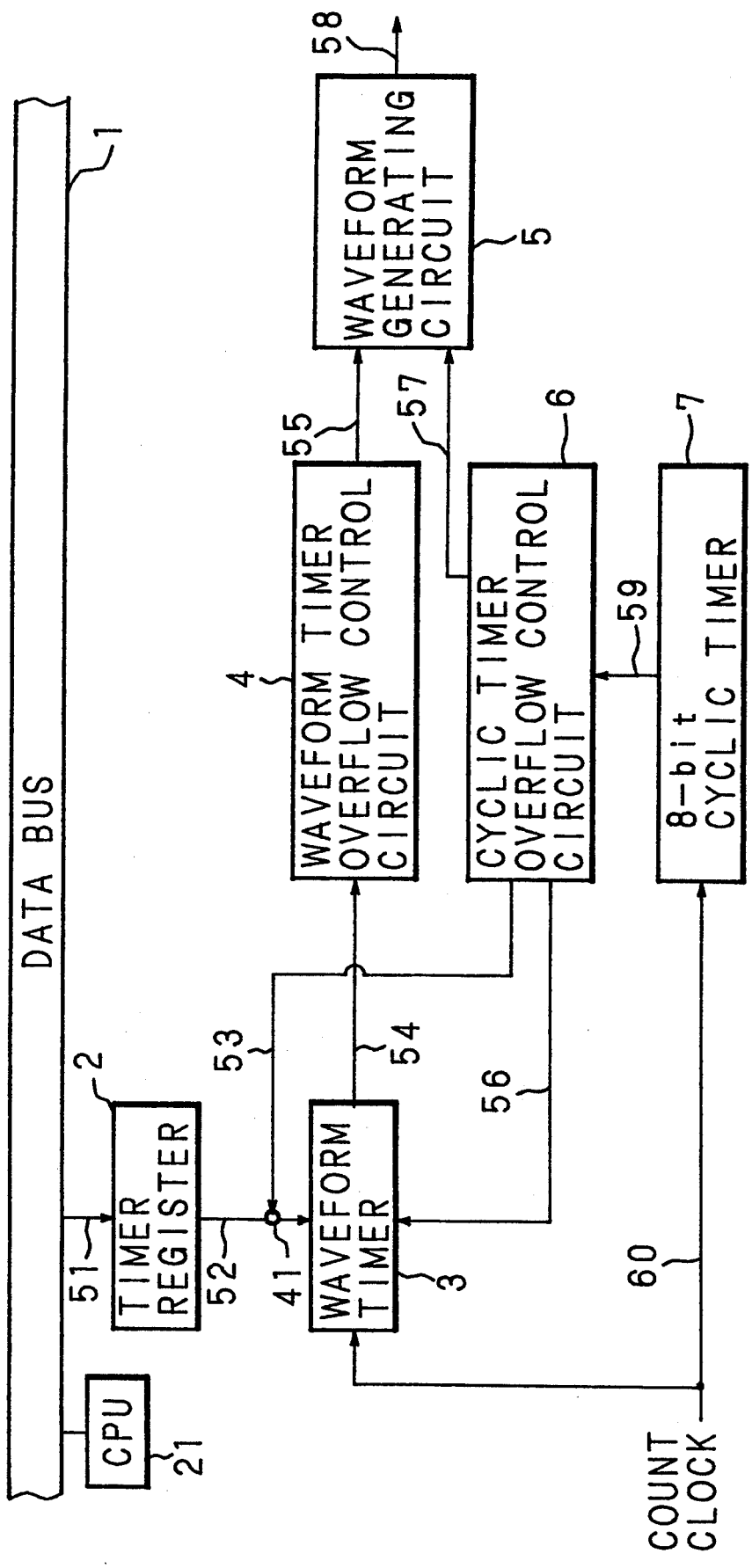
FIG. 1 is a block diagram showing a configuration of a PWM modulator as one example of a conventional pulse width modulator.
Figure 4:
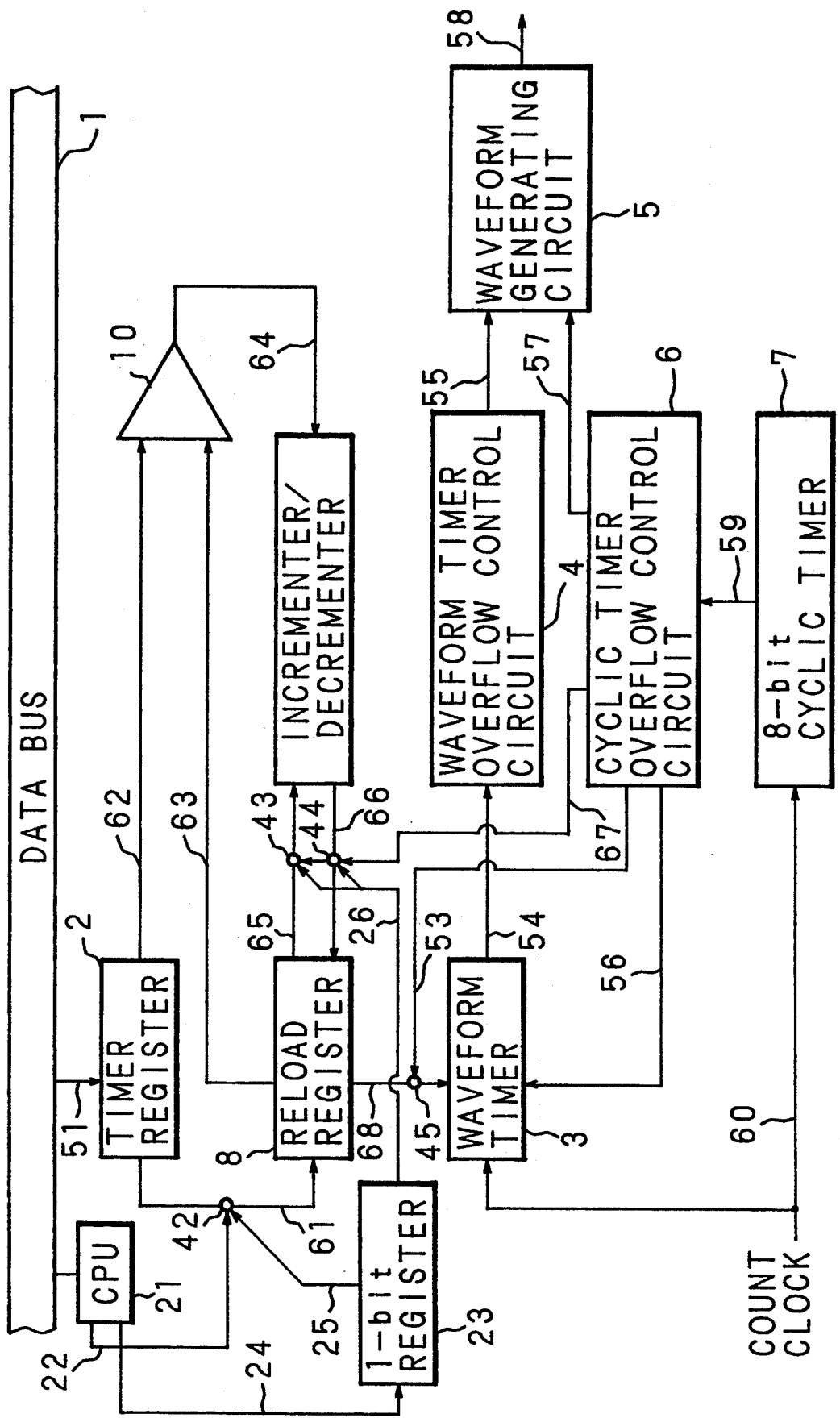
FIG. 4 is a block diagram showing a configuration of a PWM modulator as one embodiment, of a first invention of a pulse width modulator of the present invention.

FIG. 4 is a block diagram showing a configuration of a PWM modulator as one embodiment of the first invention. In addition, in FIG. 4, the same reference numerals as in FIG. 1 referred to in the description of an aforementioned conventional example designate the same or corresponding elements.

In FIG. 4, numeral 1 designates a data bus connected to a CPU 21 which is a control center of an entire PWM modulator.

Numeral 2 designates an 8-bit timer register as first storing means, and 8 bits in the data bus 1 are connected thereto via a signal line 51. An 8-bit set value outputted to the data bus 1 from the CPU 21 is stored in the timer register 2.

Numeral 8 designates an 8-bit reload register as second storing means. The reload register 8 is connected to the above-mentioned timer register 2 through a signal line 61 provided with a gate 42 in the midway thereof, and when the gate 42 is opened, the 8-bit set value stored in the timer register 2 is loaded as a reload value.

The gate 42 is opened and closed by a control signal given from the CPU 21 via a signal line 22.

Numeral 3 designates an 8-bit waveform timer as second timing means. The waveform timer 3 is connected to the above-mentioned reload register 8 through a signal line 68 provided with a gate 45 in the midway thereof, and when the gate 45 is opened, the 8-bit reload value stored in the reload register 8 is loaded as count data. While, the count clock serving as a source clock is inputted to the waveform timer 3 via a signal line 60, counts down the count clock with a value loaded from the reload register 8 as an initial value of the count data, and outputs the count value to a waveform timer overflow control circuit 4 via a signal line 54. However, the waveform timer 3 starts the counting operation by a count trigger signal given from a cyclic timer overflow control circuit [$ to be described later via a signal line 56.

As stated above, the waveform timer overflow control circuit 4 inputs a count value of the waveform timer 3 given from the waveform timer 3 via the signal line 54, and when the value overflows, specifically, when it becomes "00H" (H represents a hexadecimal number), outputs a waveform trigger signal to a waveform generating circuit 5 being a waveform generating means via a signal line 55.

The waveform generating circuit 5 generates a PWM output waveform as an output signal of the PWM modulator, whose entire configuration is shown in FIG. 4, and outputs it to the outside via a signal line 58. Specifically, when the waveform trigger signal is given from the waveform timer overflow control circuit 4 via the signal line 55, the waveform generating circuit 5 outputs "L" level signal thereafter, and when the waveform trigger signal is given from the cyclic timer overflow control circuit 6 via a signal line 57, outputs "H" level signal thereafter.

In other words, the waveform generating circuit changes the PWM output waveform into "L" level when the waveform trigger signal is given from the waveform timer overflow control circuit 4, and changes the PWM output waveform into "H" level when the waveform trigger signal is given from the cyclic timer overflow control circuit 6.

Numeral 7 designates an 8-bit cyclic timer as first timing means, to which is inputted the count clock via the signal line 60 in the same way as the waveform timer 3. The cyclic timer 7 repeats the down counting operation of the count clock from "FFH" to "00H", and outputs the count value to the cyclic timer overflow control circuit 6 via a signal line 69.

When a count value of the cyclic timer 7 inputted via the signal line 59 becomes "00H", the cyclic timer overflow control circuit 6 outputs the waveform trigger signal to the waveform generating circuit 5 via the signal line 57, the count start trigger signal to the waveform timer 3 via the signal line 56, an input control signal to a gate 45 via the signal line 53, and further outputs an increment and decrement control signal of an incrementer/decrementer 9 as incrementing/decrementing means to be described later, to gates 43 and 44 via a signal line 67.

Numeral 10 designates a comparing circuit as comparing means, in which a set value of the timer register 2 is inputted to one input terminal via a signal line 62, and a reload value of the reload register 8 is inputted to the other input terminal via a signal line 63. The comparing circuit. 10 compares two inputs and outputs a signal representing the comparing result to the incrementer/decrementer 9 via a signal line 64.

The incrementer/decrementer 9, to which the signal representing the comparing result of the comparing circuit 10 is given via the signal line 64 as stated above, operates as the decrementer responsive to the result, specifically, when the set value of the timed register 2 is smaller than the reload value of the reload register 8, and conversely, when the set value of the timer register 2 is larger than the reload value of the reload register 8, operates as the incrementer.

The incrementer/decrementer 9 increments or decrements the reload value of the reload register 8 given via the signal line 65 provided with the gate 43, and gives the increment and decrement value to the reload register 8 via a signal line 66 provided with the gate 44.

The gate 45 is provided so as to load the reload value of the reload register 8 to the waveform timer 3 as count data as stated before. As aforementioned, the gate 45 is opened and closed by the input control signal of reload data given from the cyclic timer overflow control circuit 6 via the signal line 53.

Numeral 23 designates a 1-bit register as third controlling means, into which "1" or "0" is set by the control from the CPU 21 via a signal line 24. For example, when "0" is set, the 1-bit register 23 controls the gate 42 as the first controlling means in an open state via a signal line 25, and controls the gates 43 and 44 as the second controlling means in a closed state via a signal line 26.

Next, the operation of the PWM modulator as one embodiment of the first, invention of the pulse width modulator of the present invention having the above-mentioned configuration is described.

In the following description, it is assumed that "1" is set in the 1-bit register 23.

In a state where the operation of the PWM modulator is stopped, the gate 42 which controls the data input to the reload register 8 from the timer register 2 is opened by the control signal from the CPU 21, and also the gate 45 which controls the count data input to the waveform timer 3 is opened. Thus, when the CPU 21 writes set value data into the 8-bit timer register 2 from the data bus 1 via the signal line 51, it is stored in the reload register 8 via the signal line 61 as the reload value, and further, stored in the waveform timer 3 via the signal line 68 as the count data.

Now, for example, it is assumed that data "55H" is written into the timer register 2 as a set value.

Figure 2:
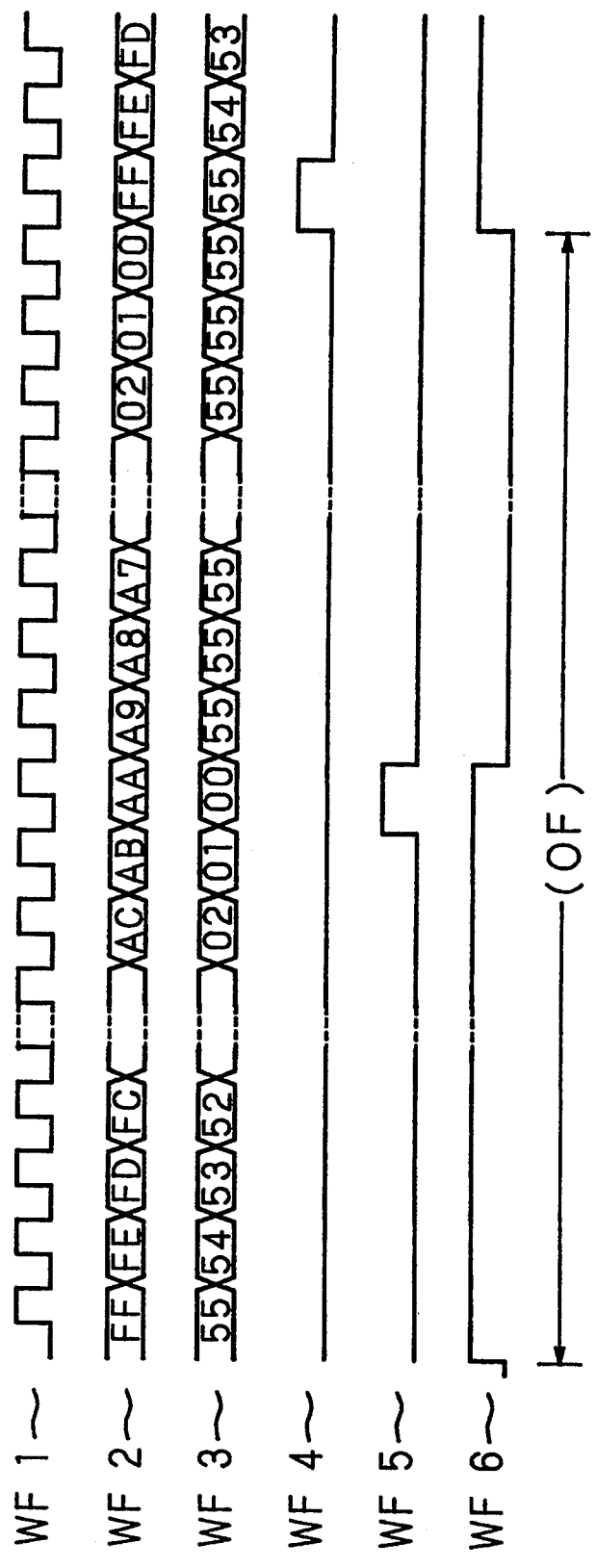
FIG. 2 is a waveform diagram showing changes of waveforms of signals, when a value of a timer register is not changed in a PWM modulator as one example of a conventional pulse width modulator.
Figure 3:
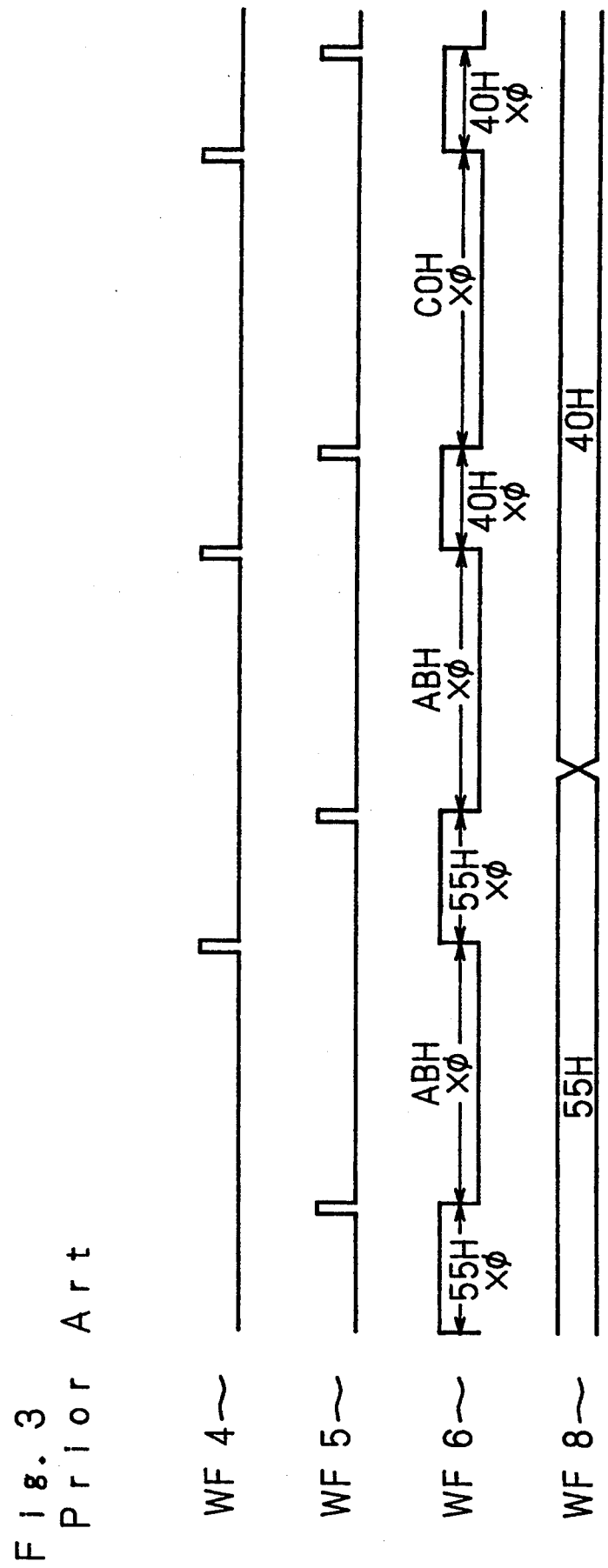
FIG. 3 is a waveform diagram showing changes of waveforms of signals, when a value of a timer register is changed in a PWM modulator as one example of a conventional pulse width modulator.

When the PWM modulator is started after data is written into the waveform timer 3, which starts simultaneously with the cyclic timer 1, arid similarly to the case of the prior art, the PWM modulation waveform is outputted to the signal line 58. The operation of outputting the PWM modulation waveform without changing the set value of the timer register 2 is similar to the case of the prior art shown in a waveform diagram of FIG. 2.

During the operation of the PWM modulator, the gate 42 which controls the data input to the reload register 8 is closed by the control signal from the CPU 21, and when the set value is written into the timer register 2, only the value of the timer register 2 is changed. Now, it is assumed that, for example, in a state where "55H" is written into the timer register 2 as the set value data as stated above, and set in the waveform timer 3 as the initial value of the count data to operate the PWM modulator, "40H" is written into the timer register 2 as data of a new set value.

The new set value data "40H" written into the timer register 2 is inputted to the comparing circuit 10 via the signal line 62. The value "55H" having been stored in the reload register 8 hitherto is also inputted to the comparing circuit 10 via the signal line 63. In the comparing circuit 10, the comparing result of the input signals is outputted to the incrementer/decrementer 9 via the signal line 64. The incrementer/decrementer 9 functions as the incrementer, when a comparing result by the comparing circuit 10 shows that the value of the timer register 2 is larger than the value of the reload register 8 and as the decrementer when smaller. Here, since the value "40H" of the timer register 2 is smaller than the value "55H" of the reload register 8, the incrementer/decrementer 9 functions as the decrementer.

When the cyclic timer 7 overflows, the cyclic timer overflow control circuit 6 gives an increment and decrement control signal to the gates 43 and 44 via the signal line 67 to open the gates 43 and 44. Thereby, the value "55H" of the reload register 8 is inputted to the incrementer/decrementer 9 via the signal line 65 and decremented by "1", and a decremented value "54H" is outputted to the reload register 8 via the signal line 66. The reload register 8 stores the decremented value "54H", and further, outputs it to the waveform timer 3 as count data via the signal line 68. As a result, since the waveform timer 3 operates the next one waveform cycle with "54H" as the count data, the next PWM waveform becomes the output corresponding to the data "54H".

When the cyclic timer 7 overflows next, since the value of the reload register 8 is similarly decremented by "1", the next PWM waveform becomes the output corresponding to "53H".

Such operations are repeated till the value of the timer register 2 and the value of the reload register 8 coincide with each other, and thereafter, the value "40H" of the reload register 8 inputted to the incrementer/decrementer 9 is outputted intact to the reload register 8. By these operations, an "H" level period of the PWM output waveform is shortened by one count clock cycle for one waveform cycle, and finally, becomes the waveform corresponding to "40H".

Figure 5:
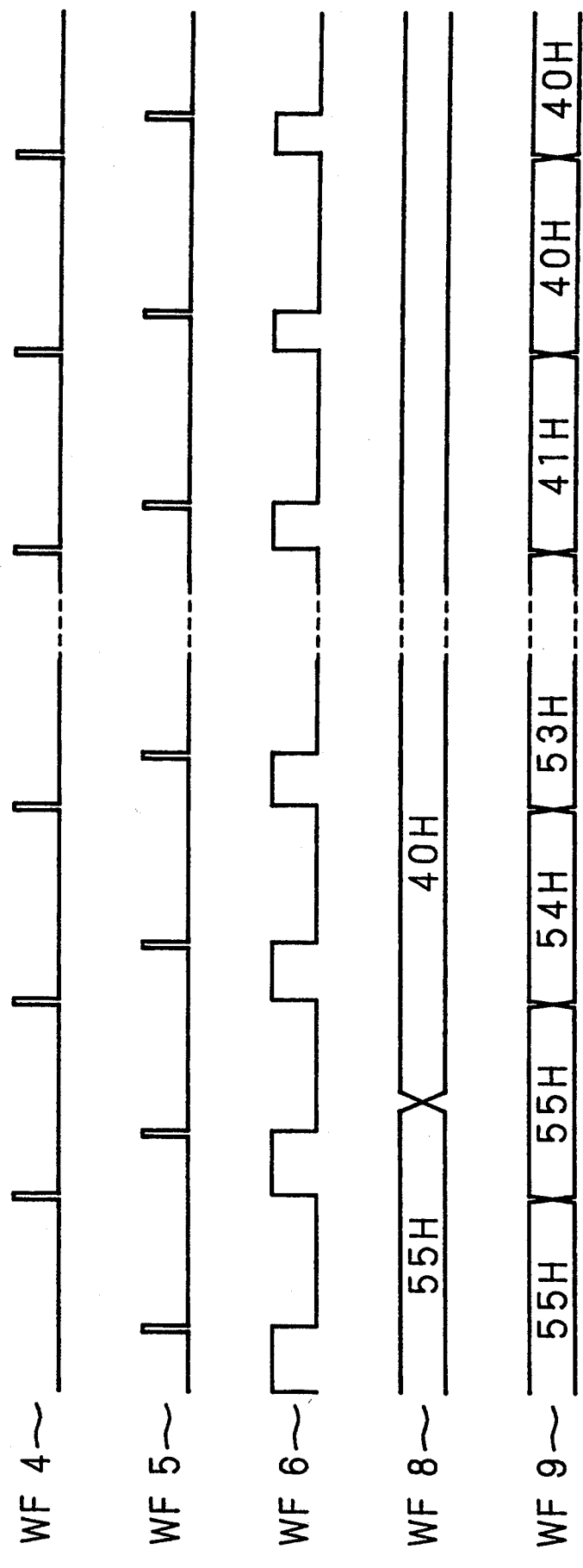
FIG. 5 is a waveform diagram showing changes of waveforms of signals, when a value of a timer register is changed in a PWM modulator of a first invention of a pulse width modulator of the present invention.

FIG. 5 is a waveform diagram showing changes of waveforms, when the value of the timer register 2 is changed as stated above. In FIG. 5, the same reference numerals as in FIG. 2 referred to in the description of the aforementioned example designate the same signal waveforms. Here, in FIG. 5, reference character WF9 designates the value of the reload register 8.

When the value of the timer register 2 is changed to "40H" from "55H" as shown WF8 in FIG. 5 during the operation of the PWM modulator, the value of the reload register 8 is decremented by "1" and becomes "54H" at the timing of next overflow of the cyclic timer 7. Thus, in the output waveform in the next one waveform cycle, a period of "one cycle ×54H of the count clock" becomes "H" level, and a period of "one cycle×ACH of the count clock" becomes "L" level.

When the cyclic timer 7 overflows next, since the value of the reload register 8 is further decremented by "1" and becomes "53H", in the output waveform, a period of "one cycle ×53H of the count clock" becomes "H" level, and a period of "one cycle×ADH of the count clock" becomes "L" level.

Such operations are repeated till the value of the timer register 2 and the value of the reload register 8 coincide with each other, and finally, in the output waveform, a period of "one cycle×40H of the count clock" becomes "H" level, and a period of "one cycle×C0H of the count clock" becomes "L" level.

Conversely, when the value of the timer register 2 is larger than the value of the reload register 8, by the incrementer/decrementer 9 functioning as the incrementer, the "H" level period of the PWM output waveform is lengthened by one cycle of the count clock for one waveform cycle.

As stated above, in the first, invention of the pulse width modulator of the present invention, the ratio of the "H" level period and the "L" level period of the output waveform can be changed slowly, against the change in value of the timer register 2.

Though the above-mentioned description is for the operation of the case where "1" is set in the 1-bit register 23, when "0" is set in the 1-bit register 23, as stated before, the gate 42 is kept opened and the gates 43 and 44 are kept closed. Thus, since the value of the timer register 2 is always loaded to the reload register 8 and the operation of the incrementer/decrementer 9 is inhibited, the pulse width modulator of the present invention shown in FIG. 4 operates similarly to the conventional pulse width modulator.

In other words, by setting either "1" or "0" in the 1-bit register 23, the pulse width modulator of the present invention shown in FIG. 4 can be operated selectively as the pulse width modulator of the present invention or as the conventional pulse width modulator.

Next, a second invention of the pulse width modulator of the present invention is described.

Figure 6:
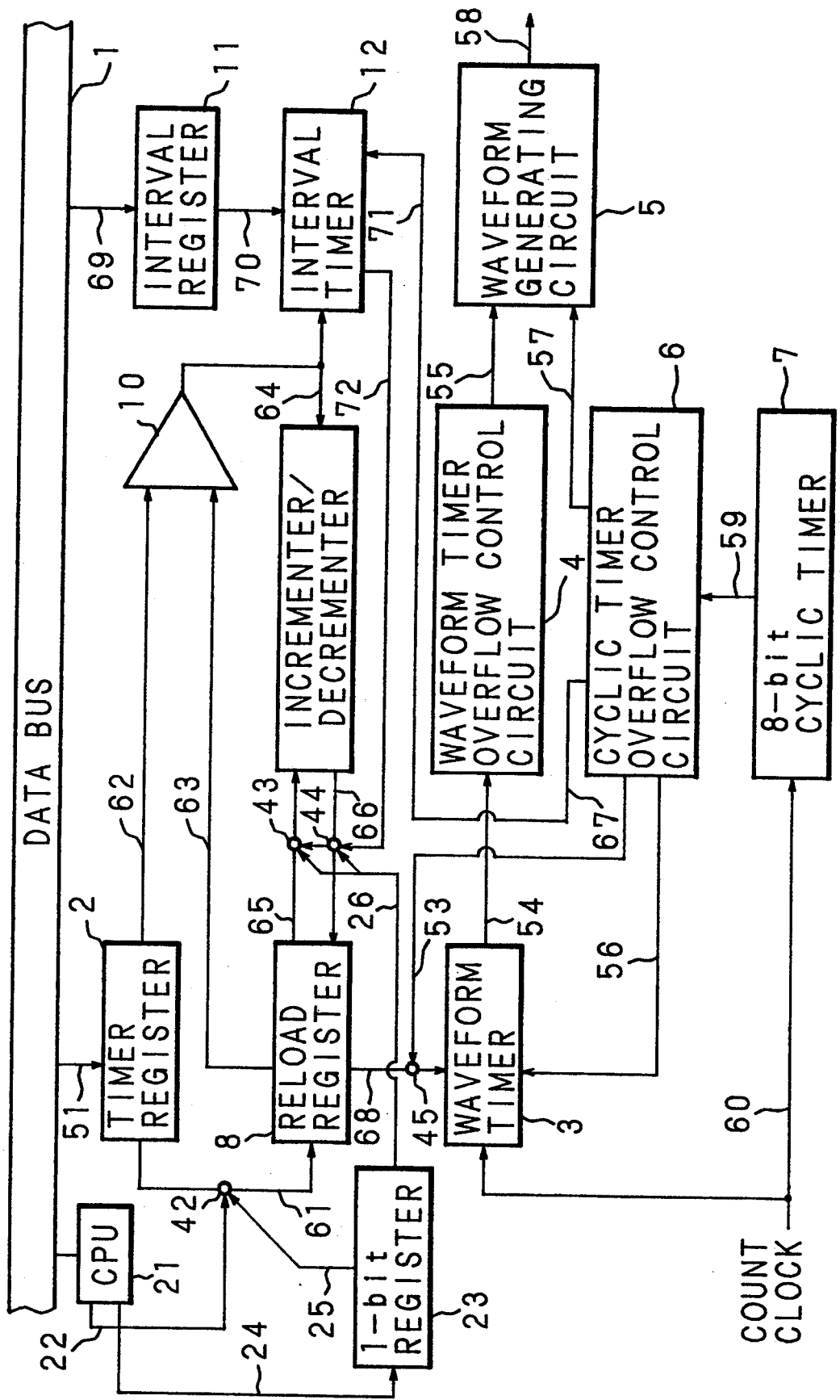
FIG. 6 is a block diagram showing a configuration of a PWM modulator as one embodiment of a second invention of a pulse width modulator of the present invention.

FIG. 6 is a block diagram showing a configuration of a PWM modulator as one embodiment of the second invention. In FIG. 6, the same reference numerals as in FIG. 4 referred to in the description of the above-mentioned first invention designate the same or corresponding elements.

A point of difference between the configurations of the second invention and the above-mentioned first invention is that, an interval register as third storing means designated by reference numeral 11 in FIG. 6, and an interval timer as third timing means designated by reference numeral 12 are provided.

Data outputted to the data bus 1 from the CPU 21 is inputted to and stored in the interval register 11 via a signal line 69. The interval timer 12 inputs the data stored in the interval register 11 via a signal line 70, and counts down a count clock with this value as an initial value, and every time the count value becomes "00H", outputs an increment and decrement, control signal of the incrementer/decrementer 9 to the gates 43 and 44 via a signal line 72, and reloads the data stored in the interval register 11 as the initial value.

The gates 43 and 44 are opened when the count value of the interval timer 12 given via the signal line 72 becomes "00H", output a reload value of the reload register 8 to the incrementer/decrementer 9 via the signal line 65, and return the value incremented or decremented by the incrementer/decrementer 9 to the reload register 8 via the signal line 66.

The interval timer 12 operates only when the comparing result signal outputted to the signal line 64 by the comparing circuit 10 is not "0", in other words, when the comparing result of the value of the timer register 2 and the value of the reload register 8 by the comparing circuit 10 does not coincide with each other.

Next, the operation of the PWM modulator as one embodiment of the second invention of the pulse width modulator of the present invention having the above-mentioned configuration is described.

Also in this case, it is assumed that "1" is set in the 1-bit register 23.

The operation at the time of starting of the PWM modulator and when outputting the PWM modulation waveform without changing the value of the timer register 2 is similar to the case of the aforementioned first invention.

As stated above, responsive to the comparing result signal of the comparing circuit 10 outputted via the signal line 64, specifically, the interval timer 12 stops when the value of the timer register 2 and the value of the reload register 8 coincide with each other, and operates when they do not coincide.

A value set in the interval register 11 is inputted to the interval timer 12, and when the value of the timer register 2 is rewritten, the interval timer 12 starts to operate. Every time the cyclic timer 7 overflows, the interval timer 12 counts down the count clock inputted from the cyclic timer overflow control circuit 6 via a signal line 71.

Now, in the first invention, the gates 43 and 44 which control the increment and decrement of the value of the reload register 8 were opened every time the cyclic timer 8 overflows. However, in the second invention, every time the count value of the interval timer 12 becomes "00H", the gates 43 and 44 are opened by the increment and decrement control signal given via the signal line 72, and the value stored in the reload register 8 is incremented or decremented. Simultaneously, the value stored in the interval register 11 is inputted to the interval timer 12 as an initial value of the counting operation.

Such operations are repeated till the value of the timer register 2 and the value of the reload register 8 coincide with each other, and after the values of the timer register 2 and the reload register 8 have coincided with each other, the interval timer 12 stops to stop the incrementing and decrementing function of the incrementer/decrementer 9.

By such operations, the "H" level period of the PWM output waveform changes by one cycle of the count clock for every cycle decided by the value set in the interval register 11.

Figure 7:
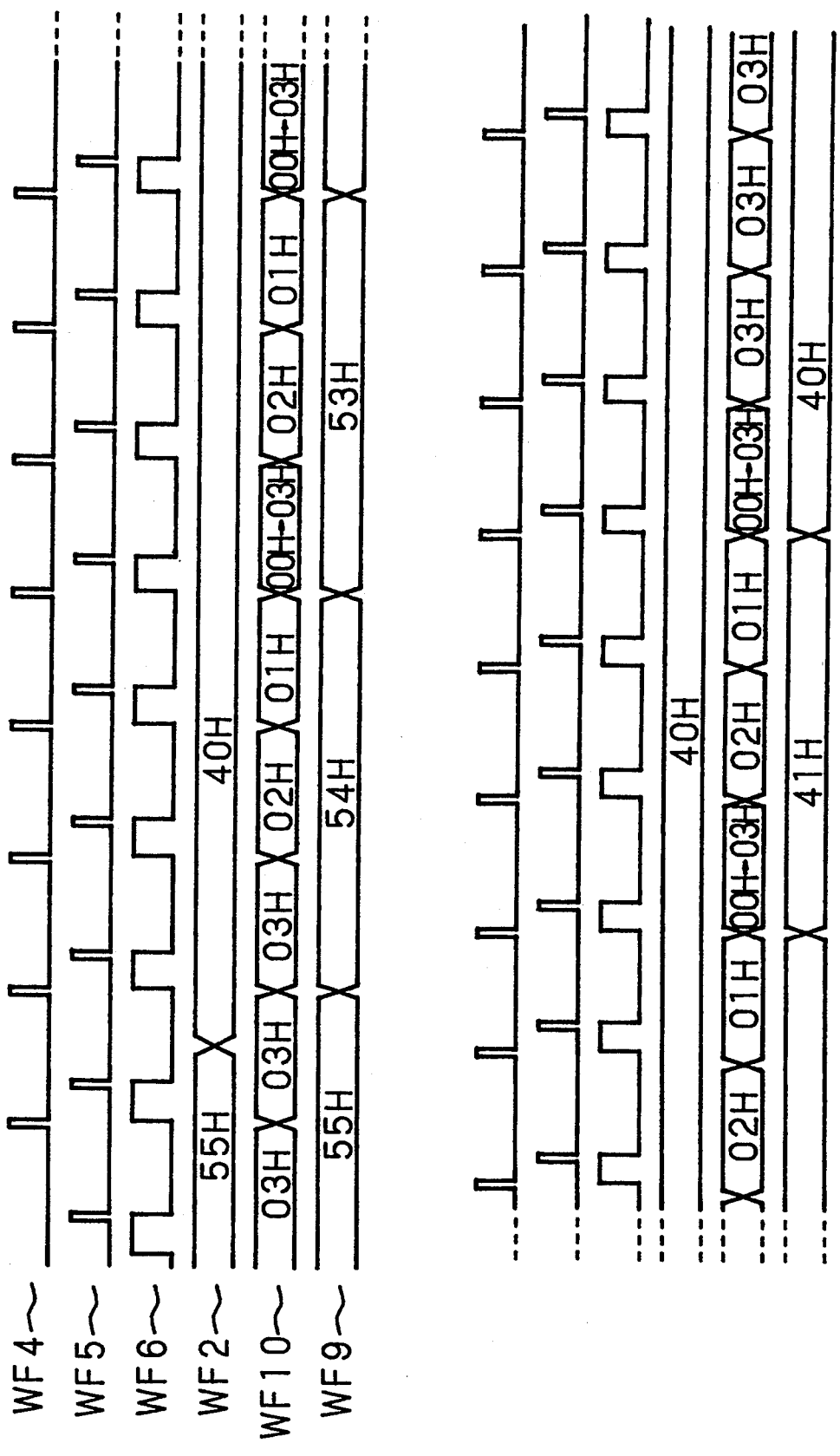
FIG. 7 is a waveform diagram showing changes of waveforms of signals, when a value of a timer register is changed in a PWM modulator of a second invention of a pulse width modulator of the present invention.

FIG. 7 is a waveform diagram showing changes of waveforms when the value of the timer register 2 is changed. In FIG. 7, the same reference numerals as in FIG. 5 referred to in the description of the aforementioned first invention designate the same signal waveforms. Here, in FIG. 7, reference character WF10 designates a count value of the interval timer 12.

When the value of the timer register 2 is changed to "40H" from "55H" as shown by WF 8 in FIG. 7 during the operation of the PWM modulator, the interval timer 12 starts to operate, and a count value of the interval timer 12 is counted down by "1" as shown by WF10 in FIG. 7, at the timing of the next overflow of the cyclic timer 7. Now, it is assumed that "03H" is set in the interval register 11, by the first overflow of the cyclic timer overflow control circuit 6, the value of the interval register 11 is counted down to "02H" from "03H". Every time the cyclic timer 7 overflows, the interval timer 12 counts down, and at the time point when the count value becomes "00H", the value of the reload register 8 is decremented by "1" as shown by WF9 in FIG. 7, and the value "03H" of the interval register 11 is inputted again to the interval timer 12.

By continuing such operations, the value of the reload register 8 is decremented by "1" for every three cycles of the waveform cycle and the output waveform is changed. These operations are repeated till the value of the timer register 2 and the value of the reload register 8 coincide with each other, and finally, a period of "one cycle×40H of the count clock" of the PWM waveform becomes "H" level and a period of "one cycle×C0H of the count clock" becomes "L" level.

As stated above, in the second invention of the pulse width modulator of the present invention, the ratio of "H" level period and "L" level period of the output waveform can be changed more slowly than the aforementioned first invention, against the change in the value of the timer register 2.

When "0" is set in the 1-bit register 23, the pulse width modulator of the present invention shown in FIG. 6 operates similarly to the conventional pulse width modulator in the same way as the first invention.

Next, a third invention of the pulse width modulator of the present invention is described.

Figure 8:
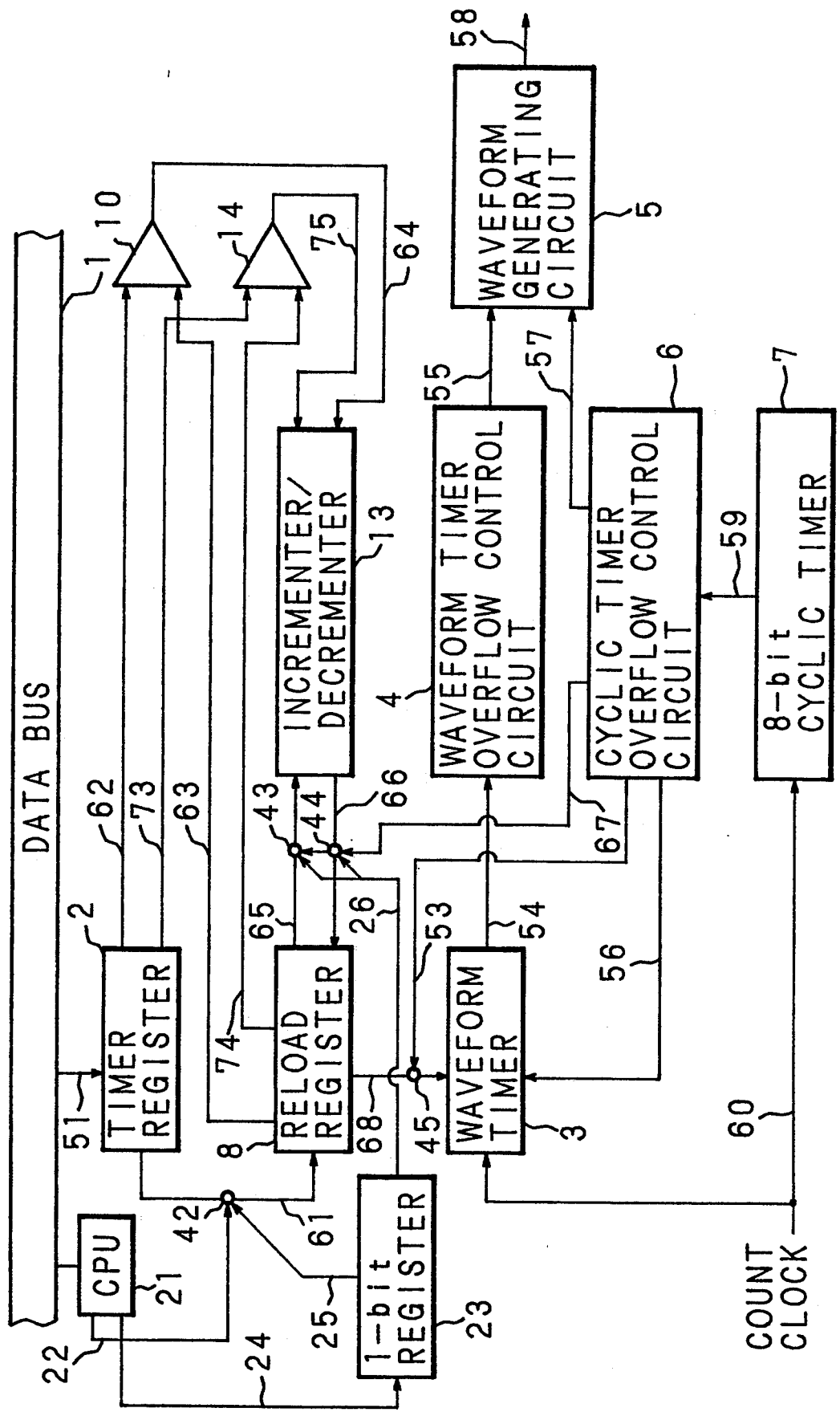
FIG. 8 is a block diagram showing a configuration of a PWM modulator as one embodiment of a third invention of a pulse width modulator of the present invention.

FIG. 8 is a block diagram showing a configuration of the PWM modulator as one embodiment of the third invention. In FIG. 8, the same reference numerals as in FIG. 4 referred to in the description of the aforementioned first invention designate the same or corresponding elements.

In the third invention, when the set value of the timer register 2 is changed, as a first step, lower four bits are coincided thereto by one cycle of the count clock, and as a second step, upper four bits are coincided thereto by $2^4$ cycles of the count clock.

Points of difference between the configurations of the third invention and the first invention are that, an incrementer/decrementer designated by reference numeral 13 in FIG. 8 has a different function from the incrementer/decrementer designated by numeral 9 in FIG. 4 and that, a lower 4-bit comparing circuit designated by reference numeral 14 is newly provided as second comparing means, besides the comparing circuit 10 as first comparing means.

Numeral 73 designates a signal line which outputs a lower 4-bit value of the timer register 2 to the lower 4-bit comparing circuit 14, numeral 74 designates a signal line which outputs a lower 4-bit value of the reload register 8 to the lower 4-bit comparing circuit 14, and numeral 75 designates a signal line which outputs a comparing signal of the lower 4 bits by the lower 4-bit comparing circuit 14 to the incrementer/decrementer 13.

Next, the operation of the PWM modulator as one embodiment of the third invention of the pulse width modulator of the present invention having the above-mentioned configuration is described.

Also in this case, it is assumed that "1" is set in the 1-bit register 23.

The operation at the time of starting of the PWM modulator and when outputting the PWM modulation waveform without changing the value of the timer register 2 is similar to the first invention.

The incrementer/decrementer 13 of the third invention shown in FIG. 8 has a different function from the incrementer/decrementer 9 of the aforedescribed first invention. That is, it is possible to switch "1" by "1", in other words, the increment and decrement of the lowermost data bit, and to switch "$2^4$" by $2^4 \infty$, in other words, the increment and decrement of the 5th bit from the lowermost data bit, by the comparing result of the lower 4 bits inputted via the signal line 75.

Now, for example, it is assumed that "55H" is written into the timer register 2 as an initial value, and the value of the timer register 2 is changed to "33H" after the PWM modulator is started. When the value of the timer register 2 is changed, the value of the timer register 2 and the value of the reload register 8 are compared with each other by the comparing circuit 10.

Here, since the value "33H" of the timer register 2 is smaller than the value "55H" of the reload register 8, the incrementer/decrementer 13 functions as the decrementer.

In the lower 4-bit comparing circuit 14, the lower 4 bits "3H" of value "33H" of the timer register 2 and the lower 4 bits "5H" of the value "55H" of the reload register 8 are compared with each other. Since the comparing result shows that they do not coincide with each other, the lower 4-bit comparing circuit 14 outputs a signal, which functions the incrementer/decrementer 13 "1" by "1", or as the decrementer of the lowermost data bit, via the signal line 75.

When the cyclic timer 7 overflows, the cyclic timer overflow control circuit 6 outputs a signal which opens the gates 43 and 44 via the signal line 67, and the value "55H" of the reload register 8 is inputted to the incrementer/decrementer 9 via the signal line 65 and is decremented by "1", and the decremented value "54H" is output ted to the reload register 8 via the signal line 66. Since the reload register 8 inputs the decremented value "54H" to the waveform timer 3, the PWM waveform in the next waveform cycle becomes the output corresponding to "54H".

When the cyclic timer 7 further overflows next, since value of the reload register 8 is similarly decremented by "1", the PWM waveform in the next waveform cycle becomes the output corresponding to "53H".

When the value of the reload register 8 becomes "53H" in such a manner, in the lower 4-bit comparing circuit 14, the lower 4 bits "3H" of the value of the timer register 2 and the lower 4 bits "3H" of the value of of the reload register 8 are compared with each other. Since the comparing result shows that they coincide with each other, the lower 4-bit comparing circuit 14 outputs a signal, which functions the incrementer/decrementer 13 by "$2^4$" or as the decrementer of the 5th bit from the lowermost data bit, via the signal line 75.

When the cyclic timer 7 overflows next, the cyclic timer overflow control circuit 6 outputs a signal which opens the gates 43 and 44 via the signal line 67. Thereby, the value "53H" of the reload register 8 is inputted to the incrementer/decrementer 13 via the signal line 65, and at this time, decremented by "$2^4$", the decremented value "43H" is outputted to the reload register 8 via the signal line 66. Since the reload register 8 inputs the decremented value "43H" to the waveform timer 3, the PWM waveform in the next waveform cycle becomes the output corresponding to "43H".

When the cyclic timer 7 further overflows next, since value of the reload register 8 is similarly decremented by "$2^4$", the PWM waveform in the next waveform cycle becomes the output corresponding to "33H". After the value of the timer register 8 and the value of the reload register 8 have coincided, the value "33H" of the reload register 8 inputted to the incrementer/decrementer 13 is outputted intact to the reload register 8.

By these operations, the "H" level period of the PWM output waveform is shortened by one cycle of the count clock for one waveform cycle as a first step, is shortened by $2^4$ cycles of the count clock for one waveform cycle as a second step, and finally, the PWM waveform becomes the output corresponding to "33H".

Figure 9:
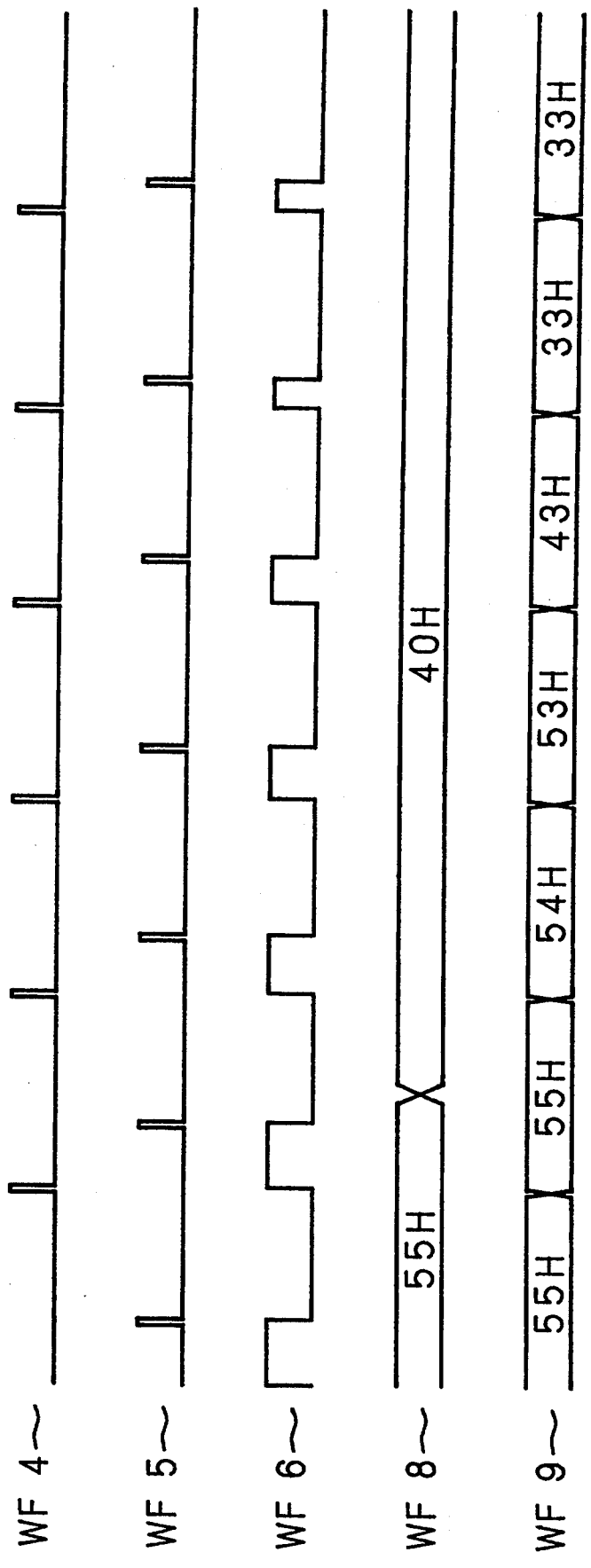
FIG. 9 is a waveform diagram showing changes of waveforms of signals, when a value of a timer register is changed in a PWM modulator of third invention of a pulse width modulator of the present invention.

FIG. 9 is a waveform diagram showing changes of waveforms, when the value of the timer register 2 is changed. In FIG. 9, the same reference numerals as in FIG. 5 referred to in the description of the first invention designate the same signal waveforms.

When the value of the timer register 2 is changed to "33H" from "55H" as shown by WF8 in FIG. 9 during the operation of the PWM modulator, the value of the reload register 8 is decremented by "1" and becomes "54H" at the next overflow timing of the cyclic timer 7, and further, when the cyclic timer 7 overflows next, the value of the reload register 8 is further decremented by "1" and becomes "53H". Since the lower 4 bits of the value of the timer register 2 and the value of the reload register 8 coincide with each other at this time point, when the cyclic timer 7 overflows next, the value of the reload register 8 is decremented by "2⁴" and becomes "43H". When the cyclic timer 7 further overflows next, the value of the reload register 8 is further decremented by "2⁴" and becomes "33H".

By such operations, after the value of the timer register 2 has been changed, a period of "one cycle×33H of the count clock" becomes "H" level at a fourth waveform cycle, and a period of "one cycle×CDH of the count clock" becomes "L" level.

As stated above, in the third invention of the pulse width modulator of the pr,;sent invention, the ratio of the "H" level period and the "L" level period of the output waveform can be changed more slowly than the conventional case, but faster than the case of the first invention against the change in the value of the timer register 2.

When "0" is set in the 1-bit register 23, as same as the first invention, the pulse width modulator of the present invention shown in FIG. 8 operates similarly to the conventional pulse width modulator.

Next, a fourth invention of the pulse width modulator of the present invention is described.

Figure 10:
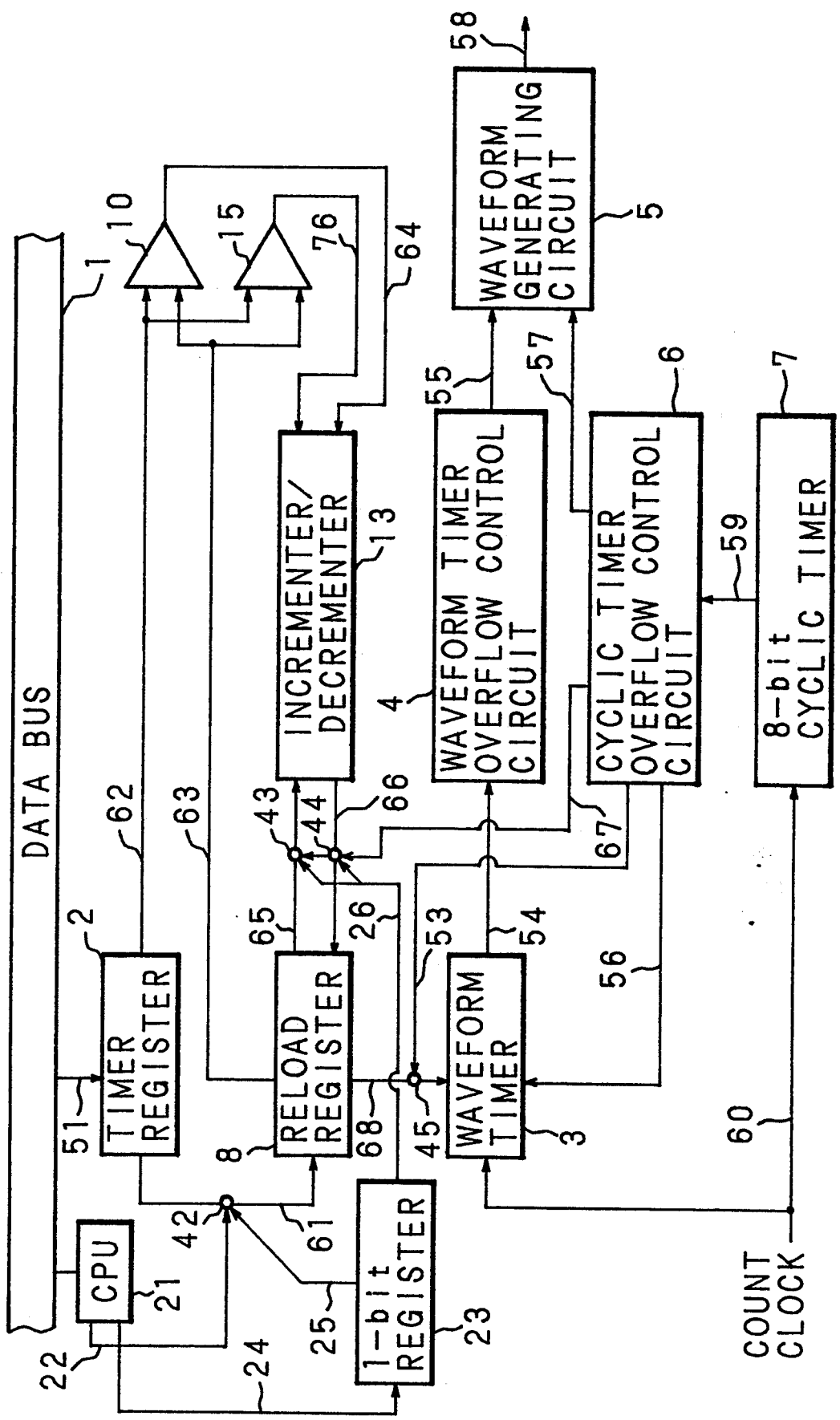
FIG. 10 is a block diagram showing a configuration of a PWM modulator as one embodiment of a fourth invention of a pulse width modulator of the present invention.

FIG. 10 is a block diagram showing a configuration of the PWM modulator as one embodiment of the fourth invention. In FIG. 10, the same reference numerals as in the figures referred to in the description of the aforementioned inventions designate the same or corresponding elements.

In the fourth invention, when the set value of the timer register 2 is changed, as a first step, the upper 4 bits are coincided with the set value of the timer register 2 by 2⁴ cycles of the count clock, and as a second step, the lower 4 bits are coincided the set value of the timer register 2 by one cycle of the count clock.

A point of difference between the configurations of the fourth invention and the third invention is that, a comparing circuit designated by numeral 15 in FIG. 10 includes a function different from the comparing circuit 14 shown in FIG. 8, specifically, includes a function to compare, whether "the difference of the values of the timer register 2 and the reload register 8≦2⁴:, or the difference of the values of the timer register 2 and the reload register 8>2⁴". In addition, numeral 76 designates a signal line for inputting a comparing result signal of the comparing circuit 15 to the incrementer/decrementer 13.

Next, the operation of the PWM modulator as one embodiment of the fourth invent ion of the pulse width modulator of the present invention having the above-mentioned configuration is described.

Also in this case, it is assumed that "1" is set in the 1-bit register 23.

The operation at the time of starting of the PWM modulator and when outputting the PWM modulation waveform without changing the value of the timer register 2 is similar to the first invention.

The incrementer/decrementer 13 shown in FIG. 10 has a same function as the incrementer/decrementer 13 of the third invention shown in FIG. 8. That is, it is possible to switch "1" by "1", in other words, the increment and decrement of the lowermost data bit, and "2⁴" by "2⁴", in other words, the increment and decrement of the 5th bit from the lowermost data bit, by the; comparing result of the lower 4 bits inputted via the signal line 76.

Now, for example, it is assumed that "55H" is written into the timer register 2 as an initial value, and the value of the timer register 2 is changed to "33H" after the PWM modulator has started to operate. When the value of the timer register 2 is changed, the value of the timer register 2 and the value of the reload register 8 are compared with each other by the comparing circuit 10.

Here, since the value "33H" of the timer register 2 is smaller than the value "55H" of the reload register 8, the incrementer/decrementer 13 functions as the decrementer.

Since the result of comparing of the two values by the comparing circuit 15 shows that the difference 22H between the values of the timer register 2 and the reload register 8 >2⁴, the incrementer/decrementer 13 functions as the decrementer of "2⁴" by "2⁴" or the 5th bit from the lowermost bit, by the comparing result signal inputted via the signal line 76.

When the cyclic timer 7 overflows, the cyclic timer overflow control circuit 6 outputs a signal which opens the gates 43 and 44 via the signal line 67, and the value. "55H" of the reload register 8 is inputted to the incrementer/decrementer 9 via the signal line 65 and decremented by "2⁴", and the decremented value "45H" is outputted to the reload register 8 via the signal line 66. Since the reload register 8 inputs the decremented value "45H" to the waveform timer 3, the PWM waveform in the next waveform cycle becomes the output corresponding to "45H".

When the cyclic timer 7 further overflows, since the value of the reload register 8 is similarly decremented further by "2⁴", the PWM waveform in the next waveform cycle becomes the output corresponding to "35H".

Since the "difference 02H between the values of the timer register 2 and the reload register 0<2⁴" when the value of the reload register 8 becomes "35H", the incrementer/decrementer 13 functions "1" by "1" or as the decrementer of the lowermost bit, by the comparing result signal inputted via the signal line 76.

When the cyclic timer 7 further overflows next, the cyclic timer overflow control circuit 6 outputs a signal which opens the gates 43 and 44 via the signal line 67. Thereby, the value "35H" of the reload register 8 is inputted to the incrementer/decrementer 13 via the signal line 65, and at this time, decremented by "1", and the decremented value "34H" is outputted to the reload register 8 via the signal line 66. Since the reload register 8 inputs the decremented value "34H" to the waveform timer 3, the PWM waveform in the next waveform cycle becomes the output corresponding to "34H".

When the cyclic timer 7 overflows still further next, similarly the value of the reload register 8 is further decremented by "1", and the PWM waveform in the next waveform cycle becomes the output corresponding to "33H". After the values of the timer register 2 and the reload register 8 have coincided with each other, the value "33H" of the reload register 8 inputted to the incrementer/decrementer 13 is outputted intact to the reload register 8.

By such operations, the "H" level period of the PWM output waveform is shortened by $2^4$ cycles of the count clock for one waveform cycle as a first step, and as a second step, shortened by one cycle of the count clock for one waveform cycle, and finally, the PWM waveform becomes the output corresponding to "33H".

FIG. 11 is a waveform diagram showing changes in waveforms, when the value of the timer register 2 is changed. In FIG. 11, the same reference numerals as in the figures referred to in the description of the inventions designate the same signal waveforms.

When the value of the timer register 2 is changed from "55H" to "33H" as shown by WF8 in FIG. 11 during the operation of the PWM modulator, the value of the reload register 8 is decremented by "$2^4$" and becomes "45H" at the next overflow timing of the cyclic timer 7. When the cyclic timer 7 further overflows next, the value of the reload register 8 is further decremented by "$2^4$" and becomes "35H". Since "the difference 02H between the values of the timer register 2 and the reload register $8 < 2^3$" at this time point, when the cyclic timer 7 overflows next, at this time, the value of the reload register 8 is decremented by "1" and becomes "34H". When the cyclic timer 7 overflows still further next, the value of the reload register 8 is further decremented by "1" and becomes "33H".

By such operations, after the value of the timer register 2 has been changed, a period of "one cycle×33H of the count clock" becomes "H" level and a period of "one cycle×CDH of the count clock" becomes "L" level at a fourth waveform cycle. In the first half of the waveform change, the "H" level period of the waveform changes by the period of "one cycle×10H of a source clock (count clock)" for every one waveform cycle, and in the second half of the waveform change, the "H" level period of the waveform changes by the period of "one cycle of the source clock" for every one waveform cycle.

As started above, in the fourth invention of the pulse width modulator of the present invention, similar to the third invention, the ratio of the "H" level period and "L" level period of the output waveform can be changed slower than the conventional example but faster than the first invention as well as a waveform change factor can be increased in the first half of the waveform change and reduced in the second half, against, the change ill value of the timer register 2.

When "0" is set ill the 1-bit register 23, in the same way as the first invention, the pulse width modulator of the present invention shown in FIG. 10 operates in the same way as the conventional pulse width modulator.

Next, a fifth invention of the pulse width modulator of the present invention is described.

In the pulse width modulator of the first invention, the gate 42 which controls count data input to the waveform timer 3 is so constituted that, it opens when the PWM modulator is stopped and closes when the PWM modulator starts to operate. The gates 43 and 44 which control the increment and decrement of the value of reload register 8 are opened by a signal outputted from the cyclic timer overflow control circuit 6 via the signal line 67, and thereby, the value of reload register 8 was incremented or decremented.

In the fifth invention, the above-mentioned control is made effective, for example, when the value set in the 1-bit register 23 is "1" as aforementioned, and when the value set in the 1-bit register 23 is "0", by always opening the gate 42 which controls the count data input to the waveform timer 3 irrespective of the operating state of the PWM modulator, and always closing the gates 43 and 44 which control the increment and decrement of the value of reload register 8, the value set in the timer register 2 is inputted intact to the reload register 8 even during the operation of the PWM modulator, and is inputted to the waveform timer 3 at the time of next overflow of the cyclic timer 7.

By the control by the 1-bit register 23 described above, when the value of the 1-bit register 23 is "1", the output waveform changes slowly against the change in the value of the timer register 2 in the same way as the first invention, and when the value of the 1-bit register 2 is "0", the output waveform changes immediately against the change in the value of the timer register 2 in the same way as the conventional example.

Also in the second, third and fourth inventions shown in FIG. 6, FIG. 8 and FIG. 10, by controlling similarly, the operation as the pulse width modulators of the second, third and fourth inventions, and the operation as the conventional pulse width modulator can be switched by the value set in the 1-bit register 23.

As stated above, in the fifth invention, since the function of the aforementioned first to fourth inventions and the function similar to the conventional example can be switched, the PWM modulator having the function of the first to fourth inventions and an inter changeability with the conventional apparatus can be obtained.

Though the PWM modulator is described as the embodiments in the first to fifth inventions, it is to be understood that it is also applicable to the pulse width modulator of the other types such as a PWM modulator and the like, and since the ratio of the "H" level period and the "L" level period of the output waveform can be changed slowly against the change in the set value of the timer register 2, for example, a load of softwares at the time of changing the number of revolutions of a DC motor slowly can be lightened.

In the embodiments of the aforementioned inventions, though the timer register 2, waveform register 3, reload register 8 and so on are described as 8 bits, it is not limited thereto.

As described above, according to the pulse width modulator of the present invention, since the pulse width modulator in which the ratio of the "H" level period and the "L" level period of the output waveform changes relatively slowly against the rate of change in the set value of a register for setting the "H" level period and the "L" level period of the pulse width modulation waveform, is obtained, for example, when it is used in controlling the DC motor, the number of revolutions of the motor can be changed slowly without any loads on softwares such as rewriting the set value of the register little by little in multisteps.

Also, since it is possible to be operated in the same way as the conventional pulse width modulator by changing the set value of the 1-bit register, it is interchangeable responsive to objects being controlled.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A pulse width modulator, comprising:

first timing means (7) for repetitively timing one waveform cycle, by repeating the counting operation of a source clock till coinciding with a predetermined count data;

first storing means (2) for storing n-bit input digital data D;

second timing means (3), to which the data D stored in said first storing means (2) is loaded as the count data, for timing a first period corresponding to "one cycle of the source clock×D", by counting the source clock till coinciding with the loaded count data;

waveform generating means (5) for generating a first level signal in a first period timed by said second timing means (3), and a second level signal in a second period corresponding to the remaining period, in the respective one-waveform cycles timed by said first timing means (7);

second storing means (8) for storing data D1 stored as an initial value of the data D in said first storing means (2), and loading to said second timing means (3) every time the one waveform cycle is timed by said first timing means (7);

comparing means (10) for comparing data D2 and the data D1 stored in said second storing means (8), when the data D1 stored in said first storing means (2) is changed to the data D2; and incrementing/decrementing means (9), which function as an incrementer when the comparing result by said comparing means (10) shows that the data D2 is larger than the data D1 and as a decrementer when smaller, for incrementing or decrementing the data D1 stored in said second storing means (8) every time the one waveform cycle is timed by said first timing means (7).

2. A pulse width modulator as set forth in claim 1, further comprising:

first controlling means (42) for, when a predetermined signal is given, controlling the data stored in said first storing means (2) to be always inputted to and stored in said second storing means (8);

second controlling means (43) and (44) for, when said predetermined signal is given, controlling said incrementing/decrementing means (9) to inhibit incrementing or decrementing of a stored value in said second storing means (8); and third controlling means (23) for controlling said predetermined signal to be given to said first and second controlling means (42), (43) and (44) responsive to the control by softwares or a signal inputted from the outside.

3. A pulse width modulator, comprising:

first timing means (7) for repetitively timing one waveform cycle, by repeating the counting operation of a source clock till coinciding with a predetermined count data;

first storing means (2) for storing n-bit input digital data D;

second timing means (3), to which the data D stored in said first storing means (2) is loaded as the count data, for timing a first period corresponding to "one cycle of the source clock×D", by counting the source clock till coinciding with the loaded count data;

waveform generating means (5) for generating a first level signal in a first period timed by said second timing means (3), and a second level signal in a second period corresponding to the remaining period, in the respective one-waveform cycles timed by said first timing means (7);

second storing means (8) for storing data D1 stored as an initial value of the data D in said first storing means (2), and loading to said second timing means (3) every time the one waveform cycle is timed by said first timing means (7);

comparing means (10) for comparing data D2 and the data D1 stored in said second storing means (8), when the data D1 stored in said first storing means (2) is changed to the data D2;

incrementing/decrementing means (9), which function as an incrementer when the; comparing result by said comparing means (10) shows that the data D2 is larger than the data D1 and as a decrementer when smaller, for incrementing or decrementing the data D1 stored in said second storing means (8) every time the one waveform cycle is timed by said first timing means (7), third storing means (11) for storing an optional value;

third timing means (12) for timing an interval cycle corresponding to said optional value, by counting a waveform cycle timed by said first timing means (7) till coinciding with said optional value stored in said third storing means (11); and said incrementing/decrementing means (9) incrementing or decrementing the data D1 stored in said second storing means (8) every time one interval cycle is timed by said third timing means (12).

4. A pulse width modulator as set forth in claim 3, further comprising:

first controlling means (42) for, when a predetermined signal is given, controlling the data stored in said first storing means (2) to be always inputted to and stored in said second storing means (8);

second controlling means (43) and (44) for, when said predetermined signal is given, controlling said incrementing/decrementing means (9) to inhibit incrementing or decrementing of a stored value in said second storing means (8); and third controlling means (23) for controlling said predetermined signal to be given to said first and second controlling means (42), (43) and (44) responsive to the control by softwares or a signal inputted from the outside.

5. A pulse width modulator, comprising:

first timing means (7) for repetitively timing one waveform cycle, by repeating the counting operation of a source clock till coinciding with a predetermined count data;

first storing means (2) for storing n-bit input digital data D;

second timing means (3), to which the data D stored in said first storing means (2) is loaded as the count data, for timing a first period corresponding to "one cycle of the source clock×D", by counting the source clock till coinciding with the loaded count data;

waveform generating means (5) for generating a first level signal in a first, period timed by said second timing means (3), and a second level signal in a second period corresponding to the remaining period, in the respective one-waveform cycles timed by said first timing means (7);

second storing means (8) for storing data D1 stored as an initial value of the data D in said first storing means (2), and loading to said second timing means (3) every time the one waveform cycle is timed by said first timing means (7);

first comparing means (10) for comparing data D2 and the data D1 stored in said second storing means (8), when the data D1 stored in said first storing means (2) is changed to the data D2;

second comparing means (14) for comparing the lower m bits of the data D2 and the lower m bits of the data D1 stored in said second storing means (8), when the data D1 stored in said first storing means (2) is changed to the data D2; and incrementing/decrementing means (13), which functions as an incrementer of a lowermost bit when the comparing result by said second comparing means (14) does not coincide and the comparing result by said first comparing means (10) shows that the data D2 is larger than the data D1 and as a decrementer of the lowermost bit when smaller, and functions as an incrementer of a $2^m$th bit from the lowermost bit when the comparing result by said second comparing means (14) coincides and the comparing result by said first comparing means (10) shows that the data D2 is larger than the data D1 and as a decrementer of the $2^m$th bit from the lowermost bit when smaller, said incrementing/decrementing means (13) incrementing or decrementing the data D1 stored in said second storing means (8) every time the one waveform cycle is timed by said first timing means (7).

6. A pulse width modulator as set forth in claim 5, further comprising:

first controlling means (42) for, when a predetermined signal is given, controlling the data stored in said first storing means (2) to be always inputted to and stored in said second storing means (8);

second controlling means (43) and (44) for, when said predetermined signal is given, controlling said incrementing/decrementing means (13) to inhibit incrementing or decrementing of a stored value in said second storing means (8); and third controlling means (23) for controlling said predetermined signal to be given to said first and second controlling means (42), (43) and (44) responsive to the control by softwares or a signal inputted from the outside.

7. A pulse width modulator, comprising:

first, timing means (7) for repetitively timing one waveform cycle, by repeating the counting operation of a source clock till coinciding with a predetermined count data;

first storing means (2) for storing n-bit input digital data D;

second timing means (3), to which the data D stored in said first storing means (2) is loaded as the count data, for timing a first period corresponding to "one cycle of the source clock×D", by counting the source clock till coinciding with the loaded count data;

waveform generating means (5) for generating a first level signal in a first, period timed by said second timing means (3), and a second level signal in a second period corresponding to the remaining period, in the respective: one-waveform cycles timed by said first timing means (7);

second storing means (8) for storing data D1 stored as an initial value of the data D in said first storing means (2), and loading to said second timing means (3) every time the one waveform cycle is timed by said first timing means (7);

first comparing means (10) for comparing data D2 and the data D1 stored in said second storing means (8), when the data D1 stored in said first storing means (2) is changed to the data D2;

second comparing means (15) for comparing whether or not the difference between the data D2 and the data D1 stored in said second storing means (8) is below $2^m$, when the data D1 stored in said first storing means (2) is changed to the data D2; and incrementing/decrementing means (13), which functions as an incrementer of a $2^m$th bit from a lowermost bit when the comparing result by said second comparing means (15) is larger than $2^m$ and the comparing result by said first comparing means (10) shows that the data D2 is larger than the data D1 and as a decrementer of the $2^m$th bit from the lowermost bit when smaller, and functions as an incrementer of the lowermost bit when the comparing result by said second comparing means (15) is below $2^m$ and the comparing result by said first comparing means (10) shows that the data D2 is larger than the data D1, and as a decrementer of the lowermost bit when smaller, said incrementing/decrementing means (13) incrementing or decrementing the data D1 stored in said second storing means (8) every time the one waveform cycle is timed by said first timing means (7).

8. A pulse width modulator as set forth in claim 7, further comprising:

first controlling means (42) for, when a predetermined signal is given, controlling the data stored in said first storing means (2) to be always inputted to and stored in said second storing means (8);

second controlling means (43) and (44) for, when said predetermined signal is given, controlling said incrementing/decrementing means (13) to inhibit incrementing or decrementing of a stored value in said second storing means (8); and third controlling means (23) for controlling said predetermined signal to be given to said first and second controlling means (42), (43) and (44) responsive to the control by softwares or a signal inputted from the outside.

* * * * *